United States Patent
Lee et al.

(10) Patent No.: US 9,397,609 B2
(45) Date of Patent: *Jul. 19, 2016

(54) PHOTOVOLTAIC MODULE

(75) Inventors: Kiok Lee, Seoul (KR); Myonghwan Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 767 days.

This patent is subject to a terminal disclaimer.

(21) Appl. No.: 13/427,139

(22) Filed: Mar. 22, 2012

(65) Prior Publication Data

US 2012/0262948 A1    Oct. 18, 2012

(30) Foreign Application Priority Data

Apr. 12, 2011   (KR) .................. 10-2011-0033728

(51) Int. Cl.
*H02S 40/34* (2014.01)
*H02S 40/32* (2014.01)

(52) U.S. Cl.
CPC ............... *H02S 40/34* (2014.12); *H02S 40/32* (2014.12)

(58) Field of Classification Search
None
See application file for complete search history.

(56) References Cited

U.S. PATENT DOCUMENTS

| | | | |
|---|---|---|---|
| 7,586,770 B2 * | 9/2009 | Toba et al. | 363/97 |
| 8,194,375 B2 * | 6/2012 | Said El-Barbari et al. | 361/91.1 |
| 8,395,919 B2 * | 3/2013 | Schroeder et al. | 363/131 |
| 8,674,668 B2 * | 3/2014 | Chisenga et al. | 323/266 |
| 8,837,097 B2 * | 9/2014 | Zuercher et al. | 361/42 |
| 2007/0227580 A1 * | 10/2007 | Nakajima | H01L 31/048 136/244 |
| 2008/0144294 A1 * | 6/2008 | Adest et al. | 361/730 |
| 2009/0296348 A1 * | 12/2009 | Russell et al. | 361/702 |
| 2010/0043868 A1 * | 2/2010 | Sun et al. | 136/251 |
| 2010/0164459 A1 * | 7/2010 | Perichon et al. | 323/284 |
| 2010/0206378 A1 | 8/2010 | Erickson, Jr. et al. | |
| 2010/0263704 A1 * | 10/2010 | Fornage et al. | 136/244 |
| 2011/0168233 A1 * | 7/2011 | Lee et al. | 136/246 |
| 2011/0194216 A1 * | 8/2011 | Schaub | H02H 7/1222 361/18 |
| 2011/0220168 A1 * | 9/2011 | Park | 136/244 |
| 2012/0033392 A1 * | 2/2012 | Golubovic et al. | 361/752 |
| 2012/0060895 A1 * | 3/2012 | Rubin | H01L 31/0504 136/246 |
| 2013/0094261 A1 * | 4/2013 | Kern | 363/98 |

FOREIGN PATENT DOCUMENTS

| | | |
|---|---|---|
| DE | 10-2008-028462 | 12/2009 |
| KR | 100990116 B1 * | 10/2010 |
| WO | WO 2009/143253 | 11/2009 |
| WO | WO 2010/132369 | 11/2010 |

* cited by examiner

*Primary Examiner* — Rexford Barnie
*Assistant Examiner* — David Shiao
(74) *Attorney, Agent, or Firm* — Dentons US LLP (57) ABSTRACT

A photovoltaic module includes: a solar cell module including a plurality of solar cells; and a junction box including a capacitor unit attached to one face of the solar cell module and that to stores DC power supplied from the solar cell module, and a dc/dc converter unit to convert the level of the stored DC power and output the same. Thus, power may be easily supplied through the junction box.

14 Claims, 10 Drawing Sheets

PHOTOVOLTAIC MODULE

CROSS-REFERENCE TO RELATED APPLICATION

This application claims the priority benefit of Korean Patent Application No. 10-2011-0033728, filed on Apr. 12, 2011, in the Korean Intellectual Property Office, the disclosure of which is incorporated herein by reference.

BACKGROUND

1. Field of the Disclosure

The present disclosure relates to a photovoltaic module (or a solar module) and, more particularly, to a photovoltaic module capable of easily supplying power 2. Description of the Related Art Recently, as existing energy resources such as oil or coal are expected to be exhausted, an interest in alternative energy for replacing oil or coal is increasing. In particular, a solar cell which directly converts (or transforms) solar energy into electric energy by using a semiconductor element is getting the spotlight as a next-generation cell.

Meanwhile, a photovoltaic module refers to a device in which solar cells for photovoltaic power generation are connected in series or in parallel, and the photovoltaic module may include a junction box collecting electricity produced by the solar cells.

SUMMARY one aspect provides a photovoltaic module capable of easily supply power through a junction box.

Another aspect provides a photovoltaic module which may be easily installed and is advantageous for increasing capacity in constituting a system.

According to another aspect, there is provided a photovoltaic module including: a solar cell module including a plurality of solar cells; and a junction box including a capacitor unit attached to one face of the solar cell module and that stores DC power supplied from the solar cell module, and a dc/dc converter unit to convert the level of the stored DC power and output the same.

According to yet another aspect, there is provided a photovoltaic module including: a solar cell module including a plurality of solar cells; and a junction box including a bypass diode attached to one face of the solar cell module and that bypasses a solar cell in which a reverse voltage occurs among the plurality of solar cells, a capacitor unit to store DC power supplied from the solar cell module, a dc/dc converter unit to convert the level of the stored DC power and output the same, and an inverter unit to convert power into AC power and output the same.

The foregoing and other objects, features, aspects and advantages according to the disclosure will become more apparent from the following detailed description when taken in conjunction with the accompanying drawings.

DETAILED DESCRIPTION

Exemplary embodiments of the present invention will now be described in detail with reference to the accompanying drawings.

In the following description, usage of suffixes such as 'module', 'part' or 'unit' used for referring to elements is given merely to facilitate explanation of the present disclosure, without having any significant meaning in itself. Thus, the 'module' and 'part' may be interchangeably used.

Figure 1:
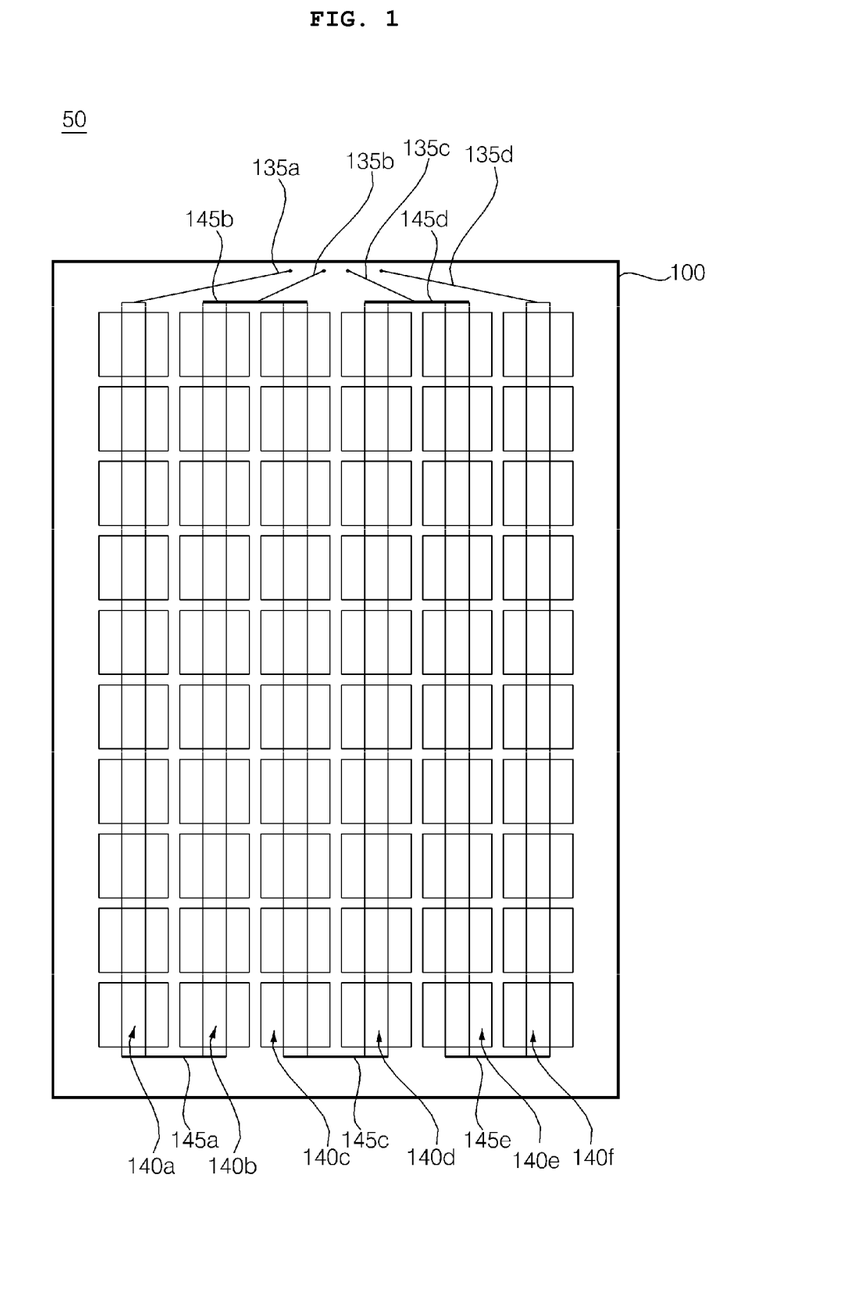
FIG. 1 is a front view of a photovoltaic module according to an embodiment of the present invention.
Figure 2:
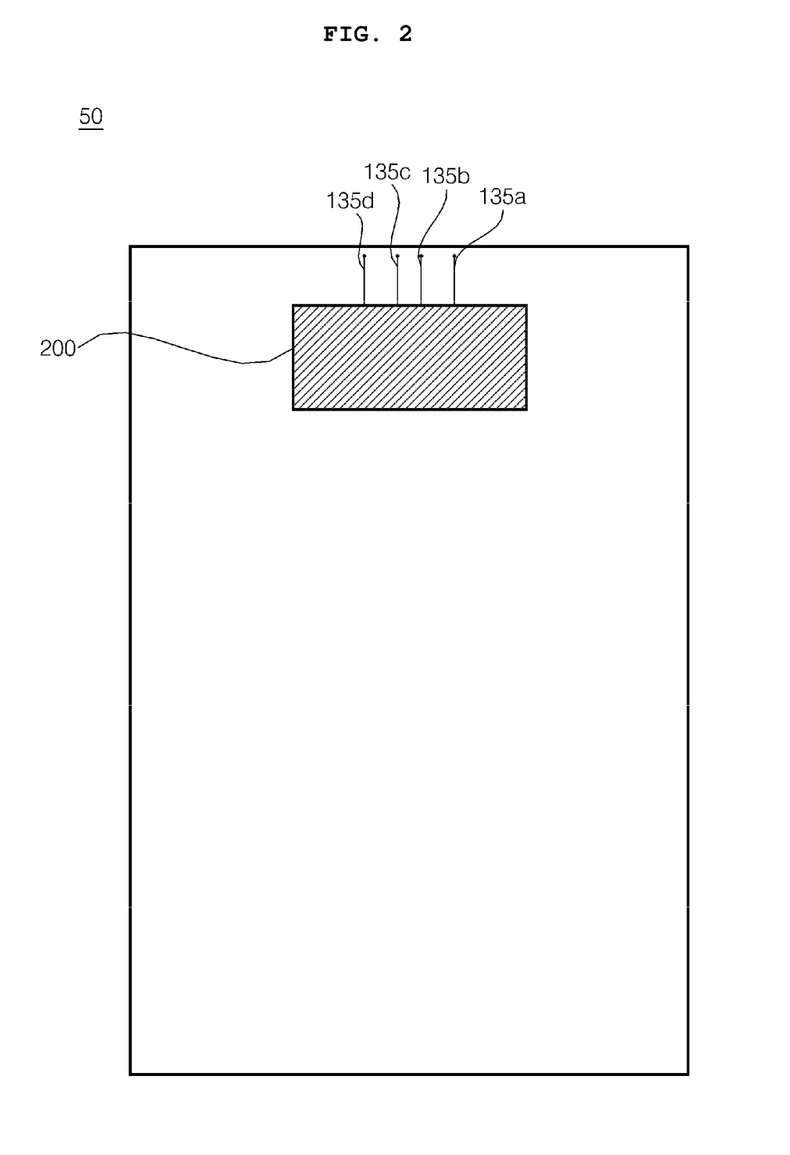
FIG. 2 is a rear view of the photovoltaic module of FIG. 1.
Figure 3:
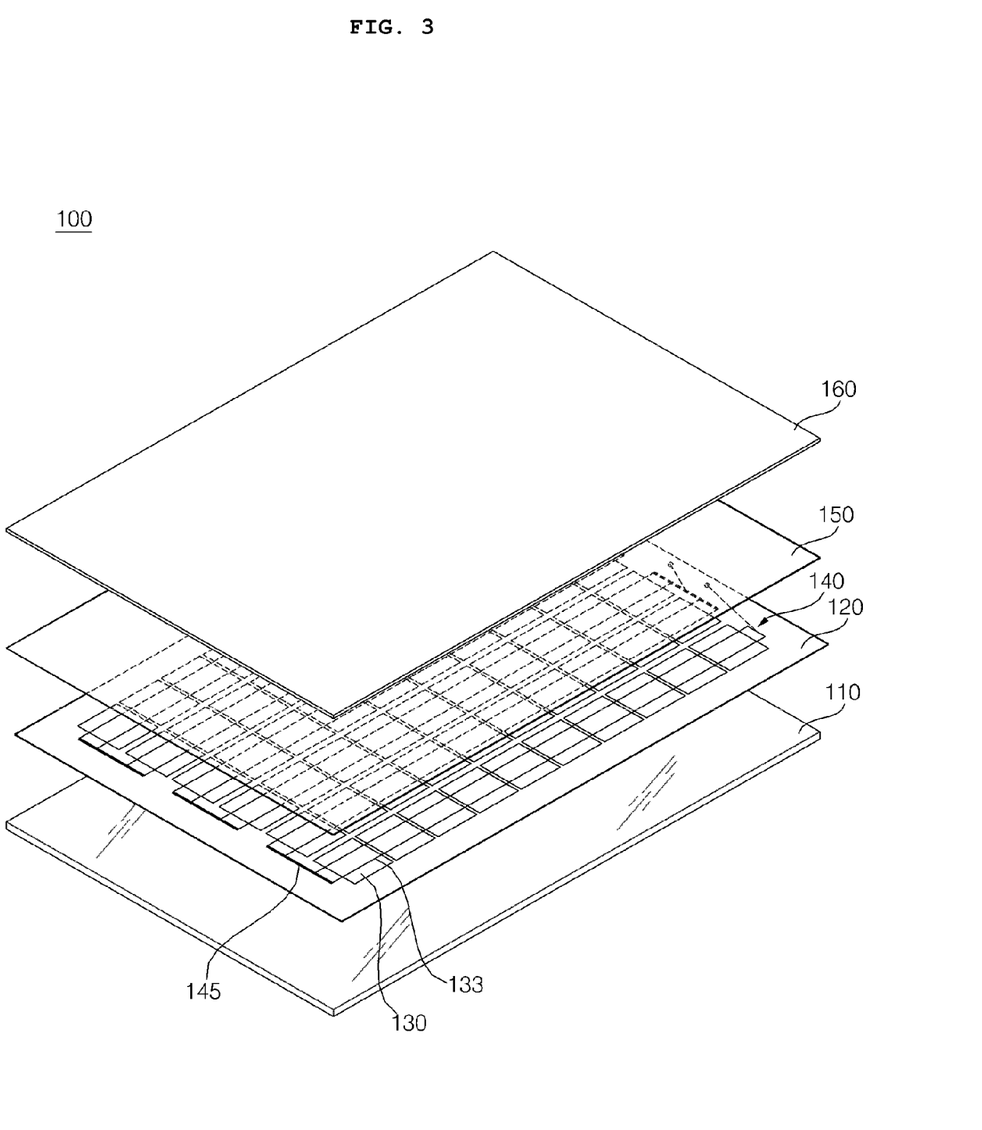
FIG. 3 is an exploded perspective view of the photovoltaic module of FIG. 1.

FIG. 1 is a front view of a photovoltaic module according to an embodiment of the present invention. FIG. 2 is a rear view of the photovoltaic module of FIG. 1. FIG. 3 is an exploded perspective view of the photovoltaic module of FIG. 1.

With reference to FIGS. 1 to 3, a photovoltaic module according to an embodiment of the present invention includes a solar cell module 100 and a junction box 200 positioned on one surface of the solar cell module 100. The solar cell module 50 may further include a heat releasing member (not shown) disposed between the solar cell module 100 and the junction box 200.

The solar cell module 100 may include a plurality of solar cells 130. Also, the solar cell module 100 may further include a first sealing member 120 and a second sealing member 150 positioned on lower and upper surfaces of the plurality of solar cells 130, a rear substrate 110 positioned on a lower surface of the first sealing member 120, and a front substrate 160 positioned on an upper surface of the second sealing member 150.

Each of the solar cells 130 is a semiconductor device converting solar energy into electric energy and may be a silicon solar cell, a compound semiconductor solar cell, a tandem solar cell, a dye-sensitized solar cell, a CdTe or CIGS type solar cell, or the like.

Each of the solar cells 130 is configured to have a light receiving face to which solar light is made incident and a rear face, which is opposite to the light receiving face. For example, each of the solar cells 130 may include a silicon substrate having a first conductivity type, a semiconductor layer formed on the silicon substrate and having a second conductivity type which is opposite to the first conductivity type, an anti-reflective film having one or more openings that expose a portion of the second conductivity type semiconductor layer and formed on the second conductivity type semiconductor layer, a front electrode in contact with the portion of the second conductivity type semiconductor layer through the one or more openings, and a rear electrode formed on a rear surface of the silicon substrate.

The respective solar cells 130 may be electrically connected in series, in parallel, or in series and parallel. In detail, the plurality of solar cells 130 may be electrically connected by a ribbon 133. The ribbon 133 may be bonded to the front electrode formed on a light receiving face of a solar cell and to the rear electrode formed on a rear surface of an adjacent solar cell 130.

In the drawing, it is illustrated that the ribbons 133 are formed in two rows, and the solar cells 130 are connected in a row by the ribbons 133, forming solar cell strings 140. Accordingly, six strings 140a, 140b, 140c, 140d, 140e, and 140f are formed, and each string includes ten solar cells. However, various modifications may be made, unlike that of the drawing.

Meanwhile, the respective solar cell strings may be electrically connected by bus ribbons. FIG. 1 illustrates that the first solar cell string 140a and the second solar cell string 140b, the third solar cell string 140c and the fourth solar cell string 140d, and the fifth solar string 140e and the sixth solar cell string 140f are electrically connected by bus ribbons 145a, 145c, and 145e disposed at a lower portion of the solar cell module 100, respectively. Also, FIG. 1 illustrates that the second solar cell string 140b and the third solar cell string 140c, and the fourth solar cell string 140d and the fifth solar cell string 140e are electrically connected by bus ribbons 145b and 145d disposed at an upper portion of the solar cell module 100, respectively.

Meanwhile, the ribbon connected to the first string, the bus ribbons 145b and 145d, and the ribbon connected to the sixth string are electrically connected to the first to fourth conductive lines 135a, 135b, 135c, and 135d, respectively, and the first to fourth conductive lines 135a, 135b, 135c, and 135d are connected with bypass diodes Da, Db, and Dc (see, for example, FIG. 4) within the junction box 200 disposed on the rear surface of the solar cell module 100. In the drawing, it is illustrated that the first to fourth conductive lines 135a, 135b, 135c, and 135d extend to the rear surface of the solar cell module 100 through openings formed on the solar cell module 100.

Meanwhile, preferably, the junction box 200 is disposed to be adjacent to be closer to an end portion, among both end portions of the solar cell module 100, where the conductive lines extend.

In FIGS. 1 and 2, the first to fourth conductive lines 135a, 135b, 135c, and 135d extend from the upper portion of the solar cell module 100 to the rear surface of the solar cell module 100, so the junction box 200 is illustrated to be positioned at the upper portion of the rear surface of the solar cell module 100. Accordingly, the length of the conductive lines may be reduced, and thus, a power lost may be reduced.

Unlike the configuration illustrated in FIGS. 1 and 2, if the first to fourth conductive lines 135a, 135b, 135c, and 135d extend from the lower portion of the solar cell module 100 to the rear surface of the solar cell module 100, the junction box 200 may be positioned at a lower portion of the rear surface of the solar cell module 100.

The rear substrate 110, as a back sheet, performs functions such as waterproofing, insulating, and filtering of ultraviolet rays. The rear substrate 110 may be a TPT (Tedlar/PET/Tedlar) type rear substrate, but is not meant to be limited thereto. Also, in FIG. 3, the rear substrate 110 has a rectangular shape but it may be fabricated to have various shapes such as a circular shape, a semi-circular shape, or the like, according to an environment in which the solar cell module 100 is installed.

Meanwhile, the first sealing member 120 may have the same size as that of the rear substrate 110 and attached to the rear substrate 110, and the plurality of solar cells 130 may be positioned to adjoin each other in several number of rows on the first sealing member 120.

The second sealing member 150 is positioned on the solar cells 130 and may be bonded to the first sealing member 120 through lamination.

Here, the first sealing member 120 and the second sealing member 150 may enable respective elements of the solar cells to be chemically bonded. The first sealing member 120 and the second sealing member 150 may be, for example, an ethylene vinyl acetate (EVA) film, or the like.

Meanwhile, preferably, the front substrate 160 is positioned on the second sealing member 150 to allow solar light to be transmitted therethrough, and may be tempered glass in order to protect the solar cells 130 against external impact, or the like. Also, more preferably, in order to prevent a reflection of solar light and increase transmittance of solar light, the front substrate may be a low iron tempered glass including a small amount of iron.

The junction box 200 is attached to the rear surface of the solar cell module 100, and may convert power by using DC power supplied from the solar cell module 100. In detail, the junction box 200 may include a capacitor unit (520 in FIG. 5) for storing DC power and a dc/dc converter unit (530 in FIG. 5) for converting the level of the DC power and outputting the same. Also, the junction box 200 may further include bypass diodes Da, Db, and Dc (510 in FIG. 5) for preventing a back flow of current among solar cell strings. Also, the junction box 200 may further include an inverter unit (540 in FIG. 5) for converting DC power into AC power. This will be described later with reference to FIG. 5.

In this manner, the junction box 200 according to an embodiment of the present invention may include at least the bypass diodes Da, Db, and Dc, the capacitor unit for storing DC power, and the dc/dc converter unit.

Figure 8:
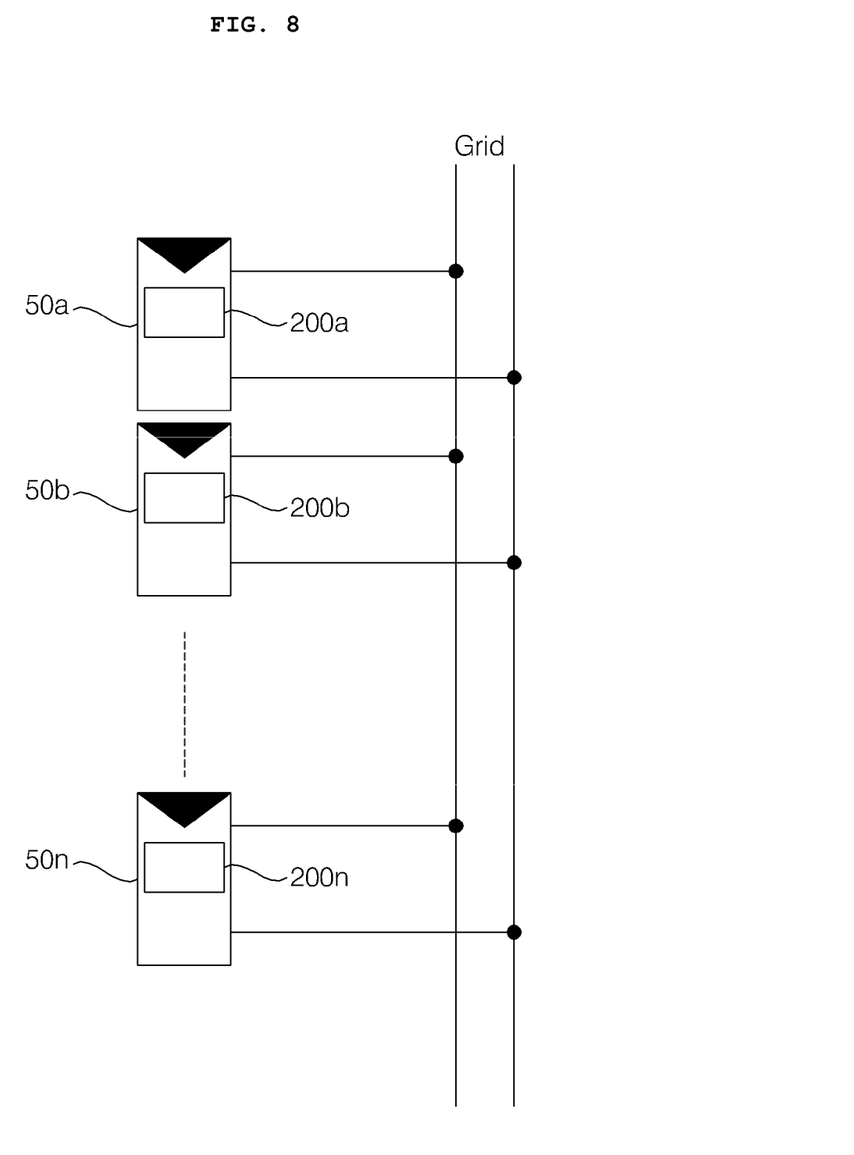
FIG. 8 is a view showing an example of the configuration of a photovoltaic system.
Figure 9:
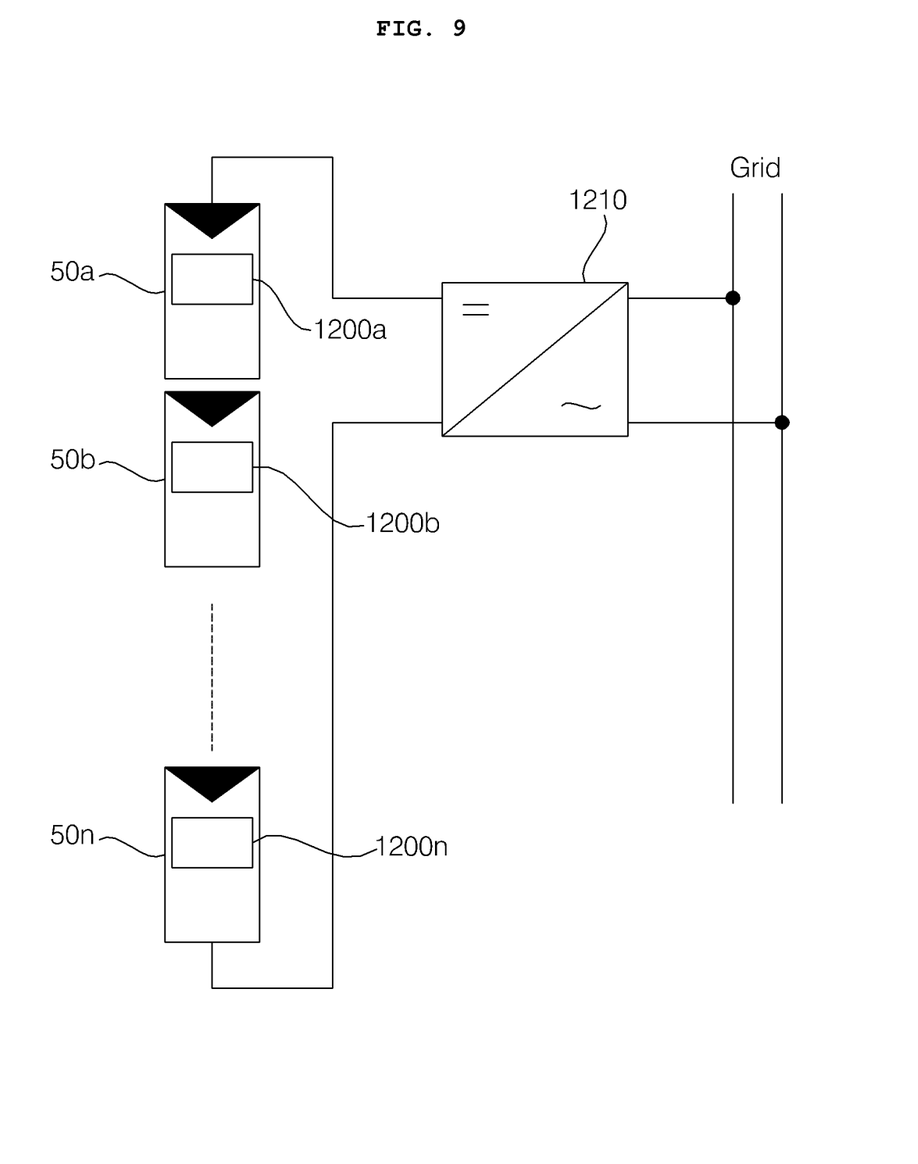
FIG. 9 is a view showing another example of the configuration of a photovoltaic system.

When the junction box 200 is integrally formed with the solar cell module 100, a loss of DC power generated by each solar cell module 100 may be minimized and effectively managed, like a solar photovoltaic system of FIG. 8 or 9. Meanwhile, the integrally formed junction box 200 may be called an MIC (Module Integrated Converter).

Meanwhile, in order to prevent an infiltration of moisture to circuit elements in the junction box 200, the interior of the junction box may be coated with silicon, or the like.

Meanwhile, openings (not shown) are formed on the junction box 200 in order to allow the foregoing first to fourth conductive lines 135a, 135b, 135c, and 135d to be connected with the bypass diodes Da, Db, and Dc in the junction box 200.

When the junction box 200 operates, heat having a high temperature is generated from the bypass diodes Da, Db, and Dc, or the like. The generated heat may reduce the efficiency of particular solar cells 130 arranged at the position where the junction box 200 is attached.

Thus, in order to prevent the efficiency problem, the photovoltaic module 50 according to an embodiment of the present invention may further include a heat releasing member (not shown) disposed between the solar cell model 100 and the junction box 200. In order to dissipate heat generated by the junction box 200, preferably, the heat releasing member may have a larger sectional area than that of a plate (not shown). For example, the heat releasing member may be formed on the entirety of the rear surface of the solar cell module 100. Preferably, the heat releasing member is made of a metal material such as gold (Au), silver (Ag), copper (Cu), aluminum (Al), tungsten (W), or the like.

An external connection terminal (not shown) may be formed at one side of the junction box 160 in order to output power-converted DC power or AC power to the outside.

Figure 4:
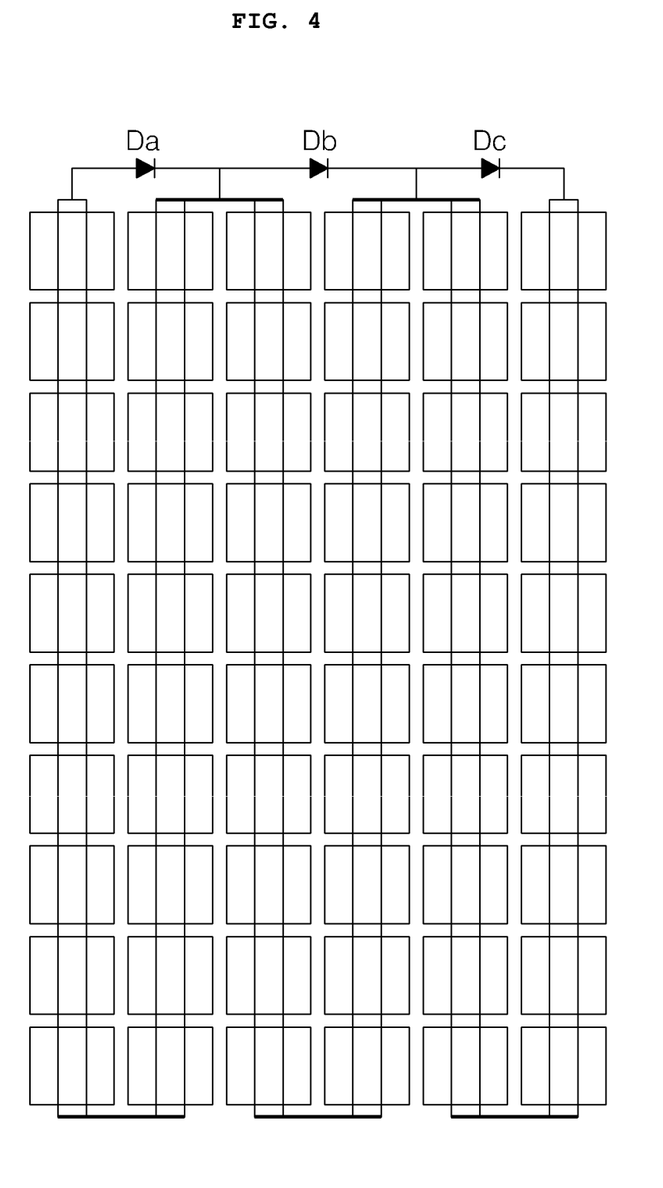
FIG. 4 is a view showing an example of bypass diodes of the photovoltaic module of FIG. 1.

FIG. 4 is a view showing an example of bypass diodes of the photovoltaic module of FIG. 1.

With reference to FIG. 4, the bypass diodes Da, Db, Dc may be connected correspondingly according to the six solar cell strings 140a, 140b, 140c, 140d, 140e, and 140f. In detail, the first bypass diode Da is connected between the first solar cell string 140a and the first bus ribbon 145b to bypass the first solar cell string 140a and the second solar cell string 140b when a reverse voltage occurs in the first solar cell string 140a or the second solar cell string 140b.

For example, when a voltage of about 0.6V, which is generated in a normal solar cell, is generated, the potential of a cathode electrode of the first bypass diode D1 is higher by about 12V (=0.6V*20) than that of an anode electrode of the first bypass diode D1. Namely, the first bypass diode D1 performs a normal operation, rather than a bypassing operation.

Meanwhile, when a hot spot occurs such as when shade occurs in a solar cell of the first solar cell string 140a or when a foreign object is attached, a reverse voltage (about 15V), not the voltage of about 0.6V, is generated from the solar cell. Accordingly, the potential of the anode electrode of the first bypass diode Da is higher by about 15V than that of the cathode electrode. Then, the first bypass diode Da performs a bypassing operation. Thus, the voltage generated in the solar cells in the first solar cell string 140a and the second solar cell string 140b is not supplied to the junction box 200. In this manner, when a reverse voltage is generated in some of the solar cells, it is bypassed, thus preventing the corresponding solar cells, or the like, from being damaged. Also, generated DC power may be supplied, except for the hot spot area. The second bypass diode Db is connected between the first bus ribbon 145b and the second bus ribbon 145d, and when a reverse voltage is generated in the third solar cell string 140c or the fourth solar cell string 140d, the second bypass diode Db bypasses the third solar cell string 140c and the fourth solar cell string 140d.

The third bypass diode Dc is connected between the sixth solar cell string and the second bus ribbon 145d, and when a reverse voltage is generated in the fifth solar cell string 140e or the sixth solar cell string 140f, the third bypass diode Dc bypasses the fifth solar cell string and the sixth solar cell string.

Meanwhile, unlike the case of FIG. 4, six bypass diodes may be connected correspondingly according to six solar cell strings, and various other modifications may also be implemented.

Figure 5:
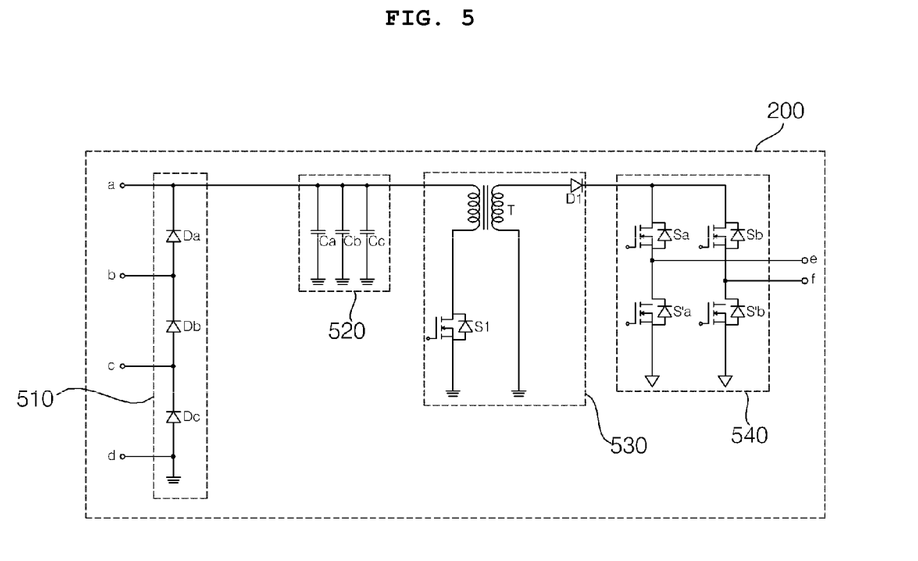
FIG. 5 is a view showing an example of an internal circuit diagram of a junction box of the photovoltaic module according to an embodiment of the invention.

FIG. 5 is a view showing an example of an internal circuit diagram of a junction box of the photovoltaic module of FIG. 1.

With reference to FIG. 5, the junction box 200 according to an embodiment of the present invention may include a bypass diode unit 510, the capacitor unit 520, the dc/dc converter unit 530, and the inverter unit 540.

The junction box 200 outputs AC power. Such a junction box 200 may be called a micro-inverter.

The bypass diode unit 510 includes first to third bypass diodes Da, Db, and Dc disposed between a, b, c, and d nodes which correspond to the first to fourth conductive lines 135a, 135b, 135c, and 135d, respectively.

The capacitor unit 520 stores DC power supplied from the solar cell module 100. In FIG. 5, it is illustrated that three capacitors Ca, Cb, and Cc are connected in parallel, but the capacitor unit is not limited thereto and the three capacitors may be connected in series or may be connected in series and parallel.

According to an embodiment of the present invention, preferably, the capacitor unit 520 is detachably attached to the junction box 200. For example, each of the capacitors Ca, Cb, and Cc have a stacked structure in which they are disposed in parallel with each other within a frame. The capacitor unit 520 may be detachably mounted as a module in a recess within the junction box 200. According to this structure, when the capacitor unit 520 is to be replaced due to its life span or when the capacitor unit 520 is broken down, the capacitor unit 520 may be easily replaced.

The dc/dc converter unit 530 performs conversion of DC power level by using the DC power stored in the capacitor unit 520. In FIG. 5, a flyback converter using a turn-on timing of a switching element S1 and a winding ratio of a transformer T is illustrated. Accordingly, voltage boosting of a dc level may be performed.

Besides the flyback converter illustrated in FIG. 5, a boost converter, a buck converter, a forward converter, or the like, may also be used as the dc/dc converter unit 530, or a combination thereof (e.g., a cascaded buck-boost converter, or the like) may also be used as the dc/dc converter unit 530.

The inverter unit 540 converts the level-converted DC power into AC power. In FIG. 5, a full-bridge inverter is illustrated. Namely, upper arm switching elements Sa and Sb connected in series and lower arm switching elements S'a and S'b connected in series are paired, and a total of two pairs of upper and lower arm switching elements are connected in parallel (Sa&S'a, Sb&S'b). Diodes are connected reversely parallel to the respective switching elements Sa, S'a, Sb, and S'b.

The switching elements in the inverter unit 540 are turned on or off based on an inverter switching control signal from an inverter controller (not shown). Accordingly, AC power having a certain frequency is outputted. Preferably, the AC power has the same frequency (about 60 Hz) as an AC frequency of grid.

Meanwhile, a capacitor unit (not shown) for storing the level-converted dc power may be further provided between the dc/dc converter unit 530 and the inverter unit 540. The capacitor unit (not shown) may include a plurality of capacitors, like the foregoing capacitor unit 520 does.

As shown in FIG. 5, because the junction box 200 includes the capacitor unit storing DC power, the dc/dc converter unit for converting the level of the stored DC power and outputting the same, and the inverter unit for converting the level-converted DC power into AC power and outputting the same, AC power may be simply supplied through the junction box 200. Also, the installation of the photovoltaic module 50 may be facilitated, and the capacitor may be easily increased in configuring a solar photovoltaic system including a plurality of photovoltaic modules.

Figure 6:
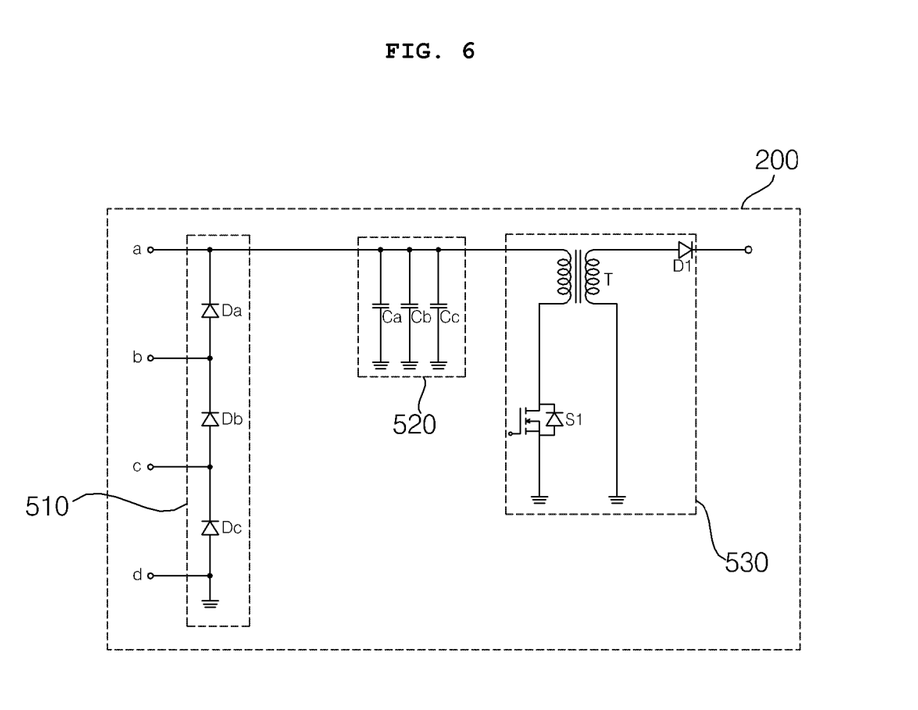
FIG. 6 is a view showing another example of an internal circuit diagram of a junction box of the photovoltaic module according to another embodiment of the invention.

FIG. 6 is a view showing another example of an internal circuit diagram of a junction box of the photovoltaic module of FIG. 1.

With reference to FIG. 6, the junction box 200 according to an embodiment of the present invention may include the bypass diode unit 510, the capacitor unit 520, and the dc/dc converter unit 530. Unlike the internal circuit diagram of FIG. 5, the internal circuit diagram of FIG. 6 does not include the inverter unit 540.

Thus, the junction box 200 may be able to output DC power. In this case, when the junction box 200 executes a power optimizing function, such a junction box 200 may be called a power optimizer.

As shown in FIG. 6, since the junction box 200 includes the capacitor unit storing DC power and the dc/dc converter unit converting the level of the stored DC power and outputting the same, the DC power may be simply supplied through the junction box 200. Also, the installation of the photovoltaic module 50 may be facilitated, and the capacitor may be easily increased in configuring a solar photovoltaic system including a plurality of photovoltaic modules.

Figure 7:
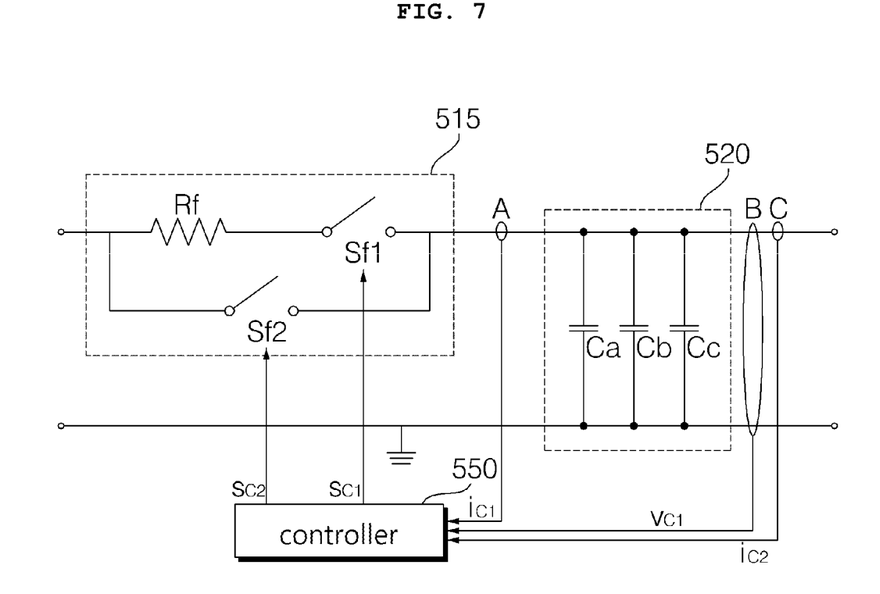
FIG. 7 is a view showing an example of a circuit diagram related to a capacitor unit according to an embodiment of the invention.

FIG. 7 is a view showing an example of a circuit diagram related to a capacitor unit of FIG. 5.

With reference to FIG. 7, the capacitor unit 520 stores DC power supplied from the solar cell module 100. In particular, in an initial operation, when current flows from the solar cell module 100 to the capacitor unit 520, an overcurrent such as peak current is instantly generated. Then, the capacitor elements C1, Cb, and Cc within the capacitor unit 520 are highly likely to be damaged.

In an embodiment of the present invention, in order to prevent an introduction of an inrush current or an overcurrent, an overcurrent preventing unit 515 is disposed between the bypass diode unit 510 and the capacitor unit 520, and a controller 550 may be further provided to control the overcurrent preventing unit 515. Namely, the junction box 200 may further include an overcurrent preventing unit 515 and a controller 550.

The overcurrent preventing unit 515 may include a first switching element Sf1 turned on during the initial operation, a second switching element Sf2 turned on after the initial operation, and a resistor element Rf connected in series to the first switching element Sf1.

For example, during the first operation, when the first switching element Sf1 is turned on, an input overcurrent component is partially consumed in the resistor element Rf and stored in the capacitor unit 520.

Next, when the second switching element Sf2 is turned on after the initial operation, the DC power supplied from the solar cell module 100 is stored in the capacitor unit 520.

Meanwhile, a first current detection unit A detects current ic1 flowing to the capacitor unit 520, and a voltage detection unit B detects voltage vc1 stored in the capacitor unit 520. The detected current ic1 and the voltage vc1 are inputted to the controller 550.

Also, the second current detection unit C detects current ic2 supplied to the dc/dc converter unit 530. The detected current ic2 is inputted to the controller 550.

The controller 550 outputs turn-on timing signals Sc1 and Sc2 of the first switching element Sf1 and the second switching element Sf2 based on the detected current ic1 or ic2 or the voltage vc1.

For example, when the detected current ic1 or ic2 or the voltage vc1 is higher than a pre-set value, the controller 550 may turn off the first switching element Sf1 and turn on the second switching element Sf2.

Meanwhile, when the detected current ic1 or ic2 or the voltage vc1 is higher than an allowable value, the controller 550 may turn off both the first switching element S1 and the second switching element Sf2 to prevent supply of DC power supplied from the solar cell module 100 to the capacitor unit 520.

Meanwhile, the controller 550 may output a converter control signal for controlling the switching element of the dc/dc converter unit 530 of FIG. 5. Also, the controller 550 may output an inverter control signal for controlling the switching elements of the inverter unit 540.

Meanwhile, the controller 550 may control the switching element of the dc/dc converter unit 530 of FIG. 5 to perform power optimizing (to be described).

Meanwhile, the overcurrent preventing unit 515 and the controller 550 may applicable to the junction box of FIG. 6 as well as to the junction box of FIG. 5.

FIG. 8 is a view showing an example of the configuration of a photovoltaic system.

With reference to FIG. 8, the solar photovoltaic system according to an embodiment of the present invention may include a plurality of photovoltaic modules 50a, 50b, . . . , 50n. The photovoltaic modules 50a, 50b, 50n may include junction boxes 200a, 200b, . . . , 200n outputting AC power, respectively. In this case, the junction boxes 200a, 200b, . . . , 200n may be micro-inverters, and AC power output from the respective junction boxes 200a, 200b, . . . , 200n is supplied to a grid.

Meanwhile, the internal circuit of the junction box 200 illustrated in FIG. 5 according to an embodiment of the present invention may be applied to the micro-inverter of FIG. 8.

FIG. 9 is a view showing another example of the configuration of a solar photovoltaic system according to an embodiment of the present invention.

With reference to FIG. 9, the solar photovoltaic system according to an embodiment of the present invention may include a plurality of photovoltaic modules 50a, 50b, 50n. The photovoltaic modules 50a, 50b, 50n may include junction boxes 1200a, 1200b, . . . , 1200n outputting DC power, respectively. Also, an inverter unit 1210 for converting DC power output from the respective photovoltaic modules 50a, 50b, 50n into AC power may be further provided. In this case, the junction boxes 1200a, 1200b, . . . , 1200n may perform power optimizing in order to effectively output DC power.

Meanwhile, the internal circuit of the junction box 200 of FIG. 6 according to an embodiment of the present invention may be applied to the power optimizer of FIG. 9.

Figure 10A:
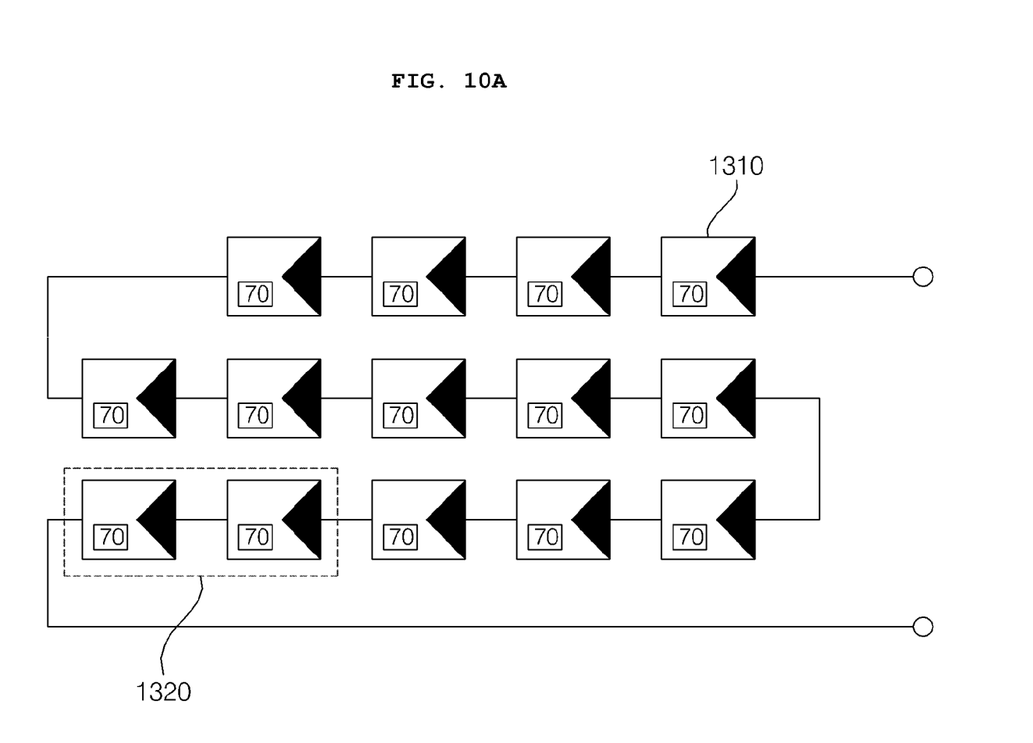
FIGS. 10A and 10B are schematic diagrams referred to explain power optimizing of the photovoltaic system according to an embodiment of the present invention.
Figure 10B:
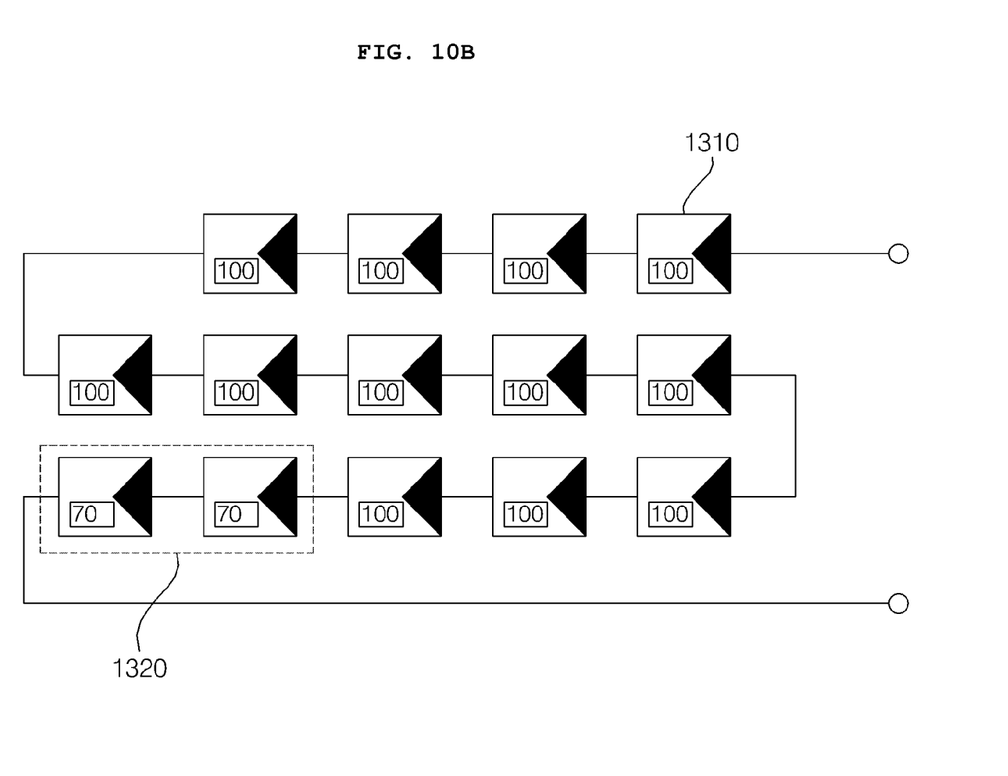

FIGS. 10A and 10B are schematic diagrams referred to in explaining power optimizing of the solar photovoltaic system according to an embodiment of the present invention.

First, a case in which power optimizing is not employed will now be described with reference to FIG. 10A. As illustrated, in a state in which a plurality of solar cell modules are connected in series, when a hot spot occurs in solar cell modules 1320 so that a power loss is made (e.g., 70 W power supply), a power loss is also made even in a normal solar cell module 1310 (e.g., 70 W power supply). Thus, only power totaling 980 W is supplied.

Next, a case in which power optimizing is employed will now be described with reference to FIG. 10B. When a hot spot occurs in solar cell modules 1320 so that a power loss is made (e.g., 70 W power supply), voltage output from the corresponding solar cell modules 1320 is lowered so that current supplied from the corresponding solar cell modules 1320 may be equal to the current supplied from a different solar cell module 1310. Thus, although a power loss (e.g., 70 W power supply) is made in the solar cell modules 1320 in which a hot spot occurs, there is no power loss in the normal solar cell module 1310 (e.g., 100 W power supply). Thus, power totaling 1340 W may be supplied.

Through power optimizing, the voltage supplied from a solar cell module in which a hot spot occurs may be adjusted according to the current supplied from a different solar cell module. To this end, each of the solar cell modules, in particular, the controller 550 of each of the solar cell modules, may control a voltage output, or the like, of its own upon receiving a current value or a voltage value supplied from a different solar cell module.

Meanwhile, the junction box 200 illustrated in FIG. 6 according to an embodiment of the present invention may be applicable to the power optimizing of FIG. 10B.

According to embodiments of the present invention, since the junction box includes the capacitor unit storing DC power and the dc/dc converter converting the level of the stored DC power and outputting the same, power may be easily supplied through the junction box.

Also, the photovoltaic module having such a junction box may be easily installed, and when a solar photovoltaic system including a plurality of photovoltaic modules is configured, the capacity may be easily increased.

Meanwhile, since the junction box includes the capacitor unit storing DC power, the dc/dc converter unit converting the level of the stored DC power and outputting the same, and the inverter unit converting the level-converted DC power into AC power and outputting the same, AC power may be simply supplied through the junction box.

Also, since the capacitor unit is detachably mounted, when the capacitor unit is defective, it may be easily replaced.

The photovoltaic module according to the embodiments of the present disclosure is not limited in its application of the configurations and methods, but the entirety or a portion of the embodiments may be selectively combined to be configured into various modifications.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A photovoltaic module comprising:
    a solar cell module including a plurality of solar cell strings formed with some of a plurality of solar cells, a plurality of bus ribbons connecting adjacent solar cell strings, and a plurality of conductive lines electrically connecting the solar cell strings and a plurality of bypass diodes; and
    a junction box on a rear surface of the solar cell module, the junction box comprising:
        the plurality of bypass diodes;
        a capacitor to store DC power supplied from the solar cell module, the capacitor detachable from the junction box;
        a dc/dc converter to convert a level of stored DC power and output the same;
        an overcurrent preventing circuit to limit a current based on a DC current supplied from the solar cell module;
        a first current detector to detect a current supplied to the capacitor;
        a voltage detector to detect a voltage at the capacitor; and
        a controller to control the overcurrent preventing circuit to stop supplying the DC power when a voltage at the capacitor is greater than an allowable value,
    wherein the plurality of conductive lines are connected with the plurality of bypass diodes and are extended to the rear surface of the solar cell module through corresponding openings penetrating a rear substrate of the solar cell module,
    wherein the overcurrent preventing circuit comprises:
        a first switching element and a second switching element between the plurality of bypass diodes and the capacitor, the first switching element and the second switching element connected in parallel; and
        a resistor connected to the first switching element,
    wherein the first switching element is turned on during an initial operation such that an input overcurrent is partially consumed in the resistor, and the second switching element is turned on after the initial operation,
    wherein the controller outputs switching signals of the first switching element and the second switching element based on detected current from the first current detector or detected voltage from the voltage detector,
    wherein when the detected current or the detected voltage is greater than a pre-set value, the controller controls the first switching element to be turned off and the second switching element to be turned on,
    wherein when the detected current or the detected voltage is greater than the allowable value, the controller controls the first switching element and the second switching element to be turned off.

2. The photovoltaic module of claim 1, wherein the plurality of bypass diodes bypass at least one solar cell in which a reverse voltage occurs among the plurality of solar cells.

3. The photovoltaic module of claim 1, wherein the dc/dc converter comprises at least one of a flyback converter, a boost converter, a buck converter, and a forward converter.

4. The photovoltaic module of claim 1, wherein the junction box further comprises:
    a second current detection unit to detect a current supplied to the dc/dc converter unit.

5. The photovoltaic module of claim 1, wherein the solar cell module further comprises:
    first and second sealing members on upper and lower surfaces of the plurality of solar cells, respectively;
    a rear substrate on a lower surface of the first sealing member; and
    a front substrate on an upper surface of the second sealing member.

6. The photovoltaic module of claim 1, wherein the solar cell module further comprises:
    a solar cell string formed with some of the plurality of solar cells connected in a row, and a first conductive line electrically connecting the solar cell string and the junction box.

7. The photovoltaic module of claim 6, wherein the solar cell module further comprises:
    a bus ribbon connected to at least two solar cell strings; and
    a second conductive line electrically connecting the bus ribbon and the junction box.

8. The photovoltaic module of claim 7, wherein the junction box is closer to an end portion, to which the conductive line extends, between two end portions of the solar cell module.

9. The photovoltaic module of claim 1, further comprising:
    a heat releasing member between the solar cell module and the junction box.

10. The photovoltaic module of claim 1, wherein the overcurrent preventing circuit is between the bypass diode unit and the capacitor.

11. The photovoltaic module of claim 1, wherein one of the plurality of conductive lines connects one of the plurality of solar cell strings and one of the plurality of bypass diodes, and
    wherein a first end of one of the plurality of conductive lines is connected to one of the plurality of bus ribbons, and a second end of the one of the plurality of conductive lines is connected to one of the plurality of bypass diodes.

12. A photovoltaic module comprising:

a solar cell module including a plurality of solar cell strings formed with some of a plurality of solar cells, a plurality of bus ribbons connecting adjacent solar cell strings, and a plurality of conductive lines electrically connecting the solar cell strings and a plurality of bypass diodes; and a junction box on a rear surface of the solar cell module, the junction box comprising:

the plurality of bypass diodes to bypass at least one solar cell in which a reverse voltage occurs among the plurality of solar cells;

a capacitor to store DC power supplied from the solar cell module, the capacitor detachable from the junction box;

a dc/dc converter to convert a level of the stored DC power and output the same;

an inverter unit to convert a level-converted DC power into AC power and output the same, an overcurrent preventing circuit to limit a current based on a DC current supplied from the solar cell module;

a first current detector to detect a current supplied to the capacitor;

a voltage detector to detect a voltage at the capacitor; and a controller to control the overcurrent preventing circuit to stop supplying the DC power when a voltage at the capacitor is greater than an allowable value, wherein the plurality of conductive lines are connected with the plurality of bypass diodes and are extended to the rear surface of the solar cell module through corresponding openings penetrating a rear substrate the solar cell module, wherein the overcurrent preventing circuit comprises:

a first switching element and a second switching element between the plurality of bypass diodes and the capacitor, the first switching element and the second switching element connected in parallel; and a resistor connected to the first switching element, wherein the first switching element is turned on during an initial operation such that an input overcurrent is partially consumed in the resistor, and the second switching element is turned on after the initial operation, wherein the controller outputs switching signals of the first switching element and the second switching element based on detected current from the first current detector or detected voltage from the voltage detector, wherein when the detected current or the detected voltage is greater than a pre-set value, the controller controls the first switching element to be turned off and the second switching element to be turned on, wherein when the detected current or the detected voltage is greater than the allowable value, the controller controls the first switching element and the second switching element to be turned off.

13. The photovoltaic module of claim 12, further comprising:

a second current detection unit to detect a current supplied to the do/dc converter unit, wherein the controller controls the overcurrent preventing unit based on the detection of the second current detection unit.

14. The photovoltaic module of claim 12, wherein one of the plurality of conductive lines connects one of the plurality of solar cell strings and one of the plurality of bypass diodes, and wherein a first end of one of the plurality of conductive lines is connected to one of the plurality of bus ribbons, and a second end of the one of the plurality of conductive lines is connected to one of the plurality of bypass diodes.

* * * * *